(12) United States Patent
Goldman et al.

(10) Patent No.: US 11,630,605 B1
(45) Date of Patent: Apr. 18, 2023

(54) METHODS AND SYSTEMS FOR PROCESSING READ-MODIFY-WRITE REQUESTS

(71) Applicant: Recogni Inc., San Jose, CA (US)

(72) Inventors: Gary S. Goldman, Los Altos, CA (US); Ashwin Radhakrishnan, Fremont, CA (US)

(73) Assignee: Recogni Inc., San Jose, CA (US)

( * ) Notice: Subject to any disclaimer, the term of this patent is extended or adjusted under 35 U.S.C. 154(b) by 0 days.

(21) Appl. No.: 17/818,876

(22) Filed: Aug. 10, 2022

(51) Int. Cl.
*G06F 3/06* (2006.01)

(52) U.S. Cl.
CPC .......... *G06F 3/0656* (2013.01); *G06F 3/064* (2013.01); *G06F 3/0611* (2013.01); *G06F 3/0673* (2013.01)

(58) Field of Classification Search
CPC ...... G06F 3/0656; G06F 3/0611; G06F 3/064; G06F 3/0673
See application file for complete search history.

(56) References Cited

U.S. PATENT DOCUMENTS

| | | | | |
|---|---|---|---|---|
| 5,235,693 | A * | 8/1993 | Chinnaswamy | .... G06F 11/1056 714/48 |
| 5,548,744 | A * | 8/1996 | Ogura | ..................... G09G 5/393 711/167 |
| 6,643,212 | B1 | 11/2003 | Jones, Jr. et al. | |
| 8,959,292 | B1 * | 2/2015 | Ahn | ..................... G06F 12/0802 711/154 |
| 9,811,263 | B1 * | 11/2017 | Teh | ....................... G06F 3/0656 |
| 10,776,668 | B2 | 9/2020 | Dutta et al. | |
| 10,931,588 | B1 * | 2/2021 | Matthews | ............... H04L 45/66 |
| 11,237,905 | B2 | 2/2022 | Chachad et al. | |
| 2003/0120880 | A1 * | 6/2003 | Banno | ................... G11C 7/1006 712/E9.019 |
| 2008/0148108 | A1 * | 6/2008 | Barnum | .............. G06F 9/30087 711/155 |
| 2017/0075823 | A1 * | 3/2017 | Ward | ................... G06F 12/1416 |
| 2017/0206036 | A1 * | 7/2017 | Pax | ......................... G11C 5/141 |
| 2017/0358327 | A1 * | 12/2017 | Oh | ........................... G11C 5/02 |
| 2018/0075344 | A1 * | 3/2018 | Ma | ......................... G06N 3/049 |

(Continued)

OTHER PUBLICATIONS

Angizi; et al., "DIMA: A Depthwise CNN In-Memory Accelerator", Association for Computing Machinery, ICCAD '18, Nov. 5-8, 2018, San Diego, CA, USA, 8 pgs.

(Continued)

*Primary Examiner* — Ramon A. Mercado
(74) *Attorney, Agent, or Firm* — Ascenda Law Group, PC

(57) ABSTRACT

A memory system comprises a plurality of memory sub-systems, each with a memory bank and other circuit components. For each of the memory sub-systems, a first buffer receives and stores a read-modify-write request (with a read address, a write address and a first operand), a second operand is read from the memory bank at the location specified by the read address, a combiner circuit combines the first operand with the second operand, an activation circuit transforms the output of the combiner circuit, and the output of the activation circuit is stored in the memory bank at the location specified by the write address. The first operand and the write address may be stored in a second buffer while the second operand is read from the memory bank. Further, the output of the activation circuit may be first stored in the first buffer before being stored in the memory bank.

8 Claims, 20 Drawing Sheets

(56) References Cited

U.S. PATENT DOCUMENTS

| | | | |
|---|---|---|---|
| 2019/0042920 A1* | 2/2019 | Akin | G06N 3/063 |
| 2019/0057302 A1 | 2/2019 | Cho et al. | |
| 2019/0205244 A1* | 7/2019 | Smith | G06F 3/065 |
| 2019/0339980 A1 | 11/2019 | Sity et al. | |
| 2020/0097406 A1* | 3/2020 | Ou | G06F 13/1673 |
| 2020/0104072 A1* | 4/2020 | Ngu | G06F 3/0604 |
| 2020/0184001 A1* | 6/2020 | Gu | G06F 12/0802 |
| 2020/0293319 A1* | 9/2020 | Lee | G06F 9/30145 |
| 2020/0356305 A1* | 11/2020 | Kim | G06F 3/0659 |
| 2021/0110876 A1* | 4/2021 | Seo | G11C 16/10 |
| 2021/0209022 A1* | 7/2021 | Song | G06N 3/063 |
| 2021/0209450 A1* | 7/2021 | Cassidy | G06N 5/04 |
| 2021/0216243 A1* | 7/2021 | Shin | G06F 3/0604 |
| 2021/0225430 A1* | 7/2021 | O | G06F 13/1668 |
| 2021/0263739 A1* | 8/2021 | Norrie | G06N 3/044 |
| 2022/0076717 A1* | 3/2022 | Mathew | G11C 7/1012 |
| 2022/0317923 A1* | 10/2022 | Balakrishnan | G06F 3/0614 |

OTHER PUBLICATIONS

Gao; et al., "TETRIS: Scalable and Efficient Neural Network Acceleration with 3D Memory", ASPLOS '17, Apr. 8-12, 2017, Xi'an, China, 14 pgs.

He; et al., "Identity Mappings in Deep Residual Networks", Cornell University, arXiv:1603.05027v3 [cs.CV] Jul. 25, 2016, 15 pgs.

Liu; et al., "Processing-in-Memory for Energy-efficient Neural Network Training: A Heterogeneous Approach", 2018 51st Annual IEEE/ACM International Symposium on Microarchitecture (MICRO), Oct. 20-24, 2018, 14 pgs.

* cited by examiner

US 11,630,605 B1

METHODS AND SYSTEMS FOR PROCESSING READ-MODIFY-WRITE REQUESTS

FIELD OF THE INVENTION

The present invention relates to methods and systems for processing read-modify-write requests, and more particularly relates to a memory system with a plurality of memory banks and other circuit components that are configured to process the read-modify-write requests.

BACKGROUND

A residual block (or residual unit) is an important architectural feature of many neural networks, particularly Convolutional Neural Networks (CNNs). In a residual block architecture, a tensor is passed through one or more convolutional layers (referred to as a "main path"), and the tensor also makes a "skip connection" bypassing those layers. The main path and the skip connection tensors are then added, element-wise. An activation function such as a "Rectifying Linear Unit" (ReLU) may be applied to the result of this element-wise sum and the result stored back into memory for subsequent use in the neural network. Additional details of residual block architectures may be found in Kaiming He et al. "Identity Mappings in Deep Residual Networks," Microsoft Research, arXiv:1603.05027v3 [cs.CV] 25 Jul. 2016.

SUMMARY OF THE INVENTION

In accordance with one embodiment of the invention, a read-modify-write request is generated to implement a residual block in a neural network. Each read-modify-write request can include both a read address and a write address along with a first operand (e.g., the "main path tensor"), and these requests are routed to the appropriate memory bank in the memory system based on the read and write addresses. A bank-specific buffer temporarily stores the write address and the first operand (e.g., the "main path tensor"), while a second operand (e.g., the "skip connection tensor") is being read from the memory bank. A bank-specific combiner circuit performs the element-wise sum of the first and second operands, and a bank-specific activation circuit optionally applies the ReLU activation function. Finally, the result is written to one of the memory banks at the address specified by the write address. Each read-modify-write request may be processed independently (and concurrently) at each memory bank. In a preferred embodiment, the read address and write address of each read-modify-write request reside in the same memory bank.

An advantage provided by the hardware architecture is that the "main path tensor" does not need to be first stored in one of the memory banks prior to being combined with the "skip connection tensor" that is read from one of the memory banks. Instead, the "main path tensor" may be temporarily stored in a per-bank buffer while the "skip connection tensor" is being retrieved from one of the memory banks.

More generally, in one embodiment, a memory system comprises a plurality of memory sub-systems, each with a memory bank and other circuit components. For each of the memory sub-systems, a first buffer receives a read-modify-write request (with a read address, a write address and a first operand), a second operand is read from the memory bank at the location specified by the read address, a combiner circuit combines the first operand with the second operand, an activation circuit transforms the output of the combiner circuit, and the output of the activation circuit is stored in the memory bank at the location specified by the write address.

For each of the memory banks, a second buffer may store the first operand while the second operand is being read from the memory bank. Additionally, for each of the memory banks, the second buffer may store the write address while the write data is being computed by the combiner circuit and the activation circuit.

In one embodiment, the output of the activation circuit may be first stored in the first buffer prior to being stored in the memory bank. In another embodiment, the output of the activation circuit may be stored in the memory bank, and such storing may bypass the first buffer. In such embodiment, a controller may be needed to mediate the access to the memory bank so that such writing of the output of the activation function circuit to the memory bank happens during a window of time that the buffer is not also accessing the memory bank.

These and other embodiments of the invention are more fully described in association with the drawings below.

DETAILED DESCRIPTION OF THE INVENTION

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention. Descriptions associated with any one of the figures may be applied to different figures containing like or similar components/steps.

A memory system is described below for processing general read-modify-write requests, and such system may be specifically adapted to implement residual block structures in the context of a CNN. It is noted that such system may also be adapted to implement residual block structures in other networks, such as a transformer neural network.

Figure 1:
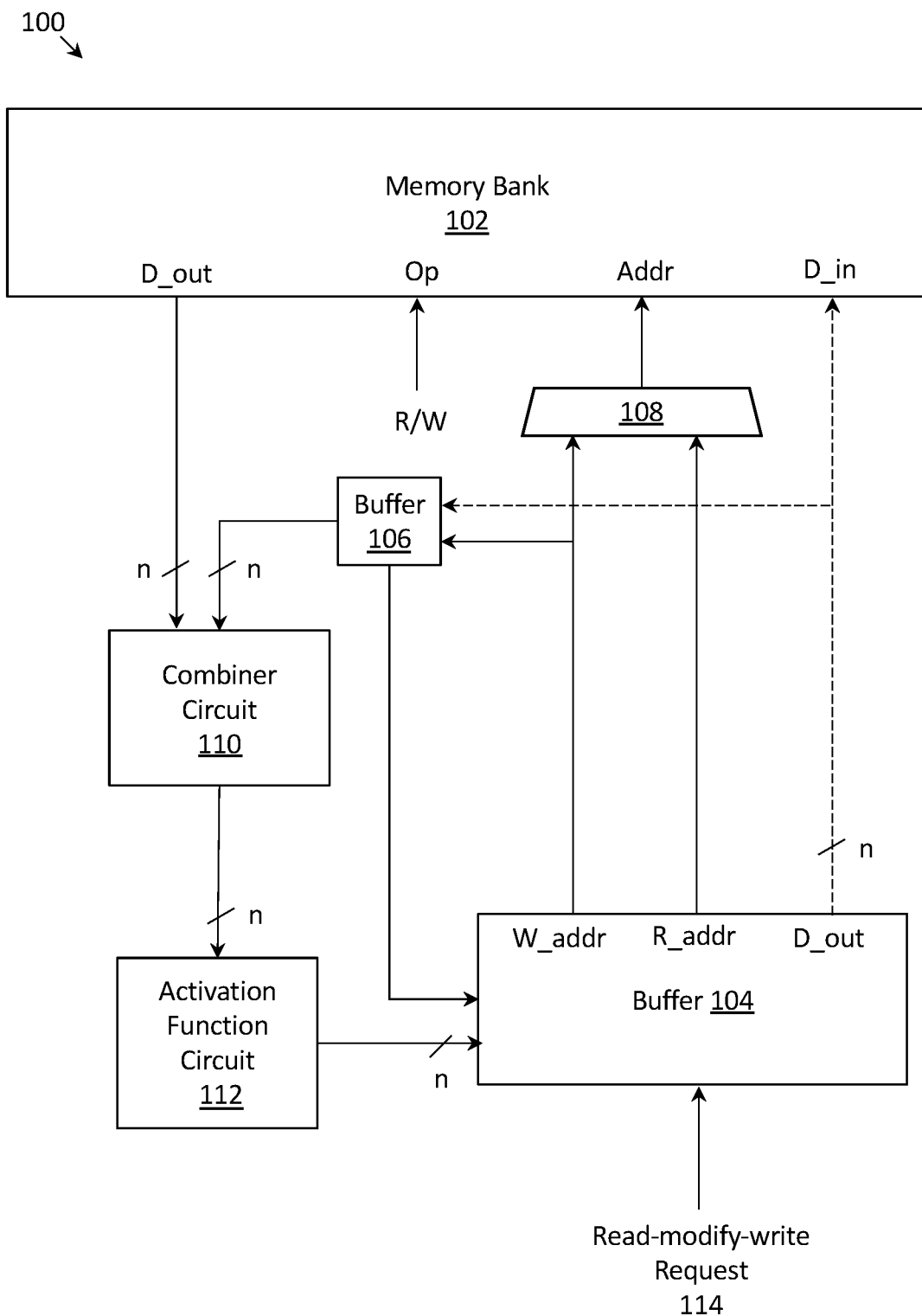
FIG. 1 depicts a block diagram of a memory sub-system for processing read-modify-write requests, in accordance with one embodiment of the invention.

FIG. 1 depicts a block diagram of a memory sub-system 100 for processing read-modify-write requests. Buffer 104 (e.g., a first-in-first-out (FIFO) buffer) may receive and store a read-modify-write request 114 that includes a read address, a write address and a first operand. A second operand is then read from the memory bank 102 from a location specified by the read address. The first operand is combined with the second operand by a combiner circuit 110, and the output of the combiner circuit 110 is provided to an activation function circuit 112. The output of the activation function circuit 112 is then stored in the memory bank 102 at the location specified by the write address. The operation of buffer 106 and multiplexor 108 are explained in more detail below in FIGS. 2C-2H.

In one embodiment, the first operand is a vector of n values and the second operand is also a vector of n values. The combiner circuit 110 may perform an element-wise combination of the first and second operands to generate an output with n values. In one embodiment, the activation function circuit 112 may apply an identical mathematical transformation on each of the n input values so as to generate n output values. In one embodiment, n may equal 1, in which case the processing of FIG. 1 may be performed on scalar values. In the context of a CNN, the first operand may be the "main path tensor" and the second operand may be the "skip connection tensor."

The activation function circuit 112 may be an optional part of the memory sub-system 100. If the operation of activation function circuit 112 is not desired, the activation function circuit 112 may be set to an identity function (i.e., with the output set equal to the input), or the output of the combiner circuit 110 may bypass the activation function circuit 112 and be stored in the memory bank 102 at the location specified by the write address.

Lastly, it is noted that the use of solid signal lines and dashed signal lines was for the purpose of clarity (i.e., to allow the reader to better distinguish between separate signal lines in instances where there are intersecting signal lines). The intersection points between the solid and dashed signal lines are not electrically connected (i.e., are not shorted), but rather it is understood that one signal line merely crosses over another signal line.

Figure 2A:
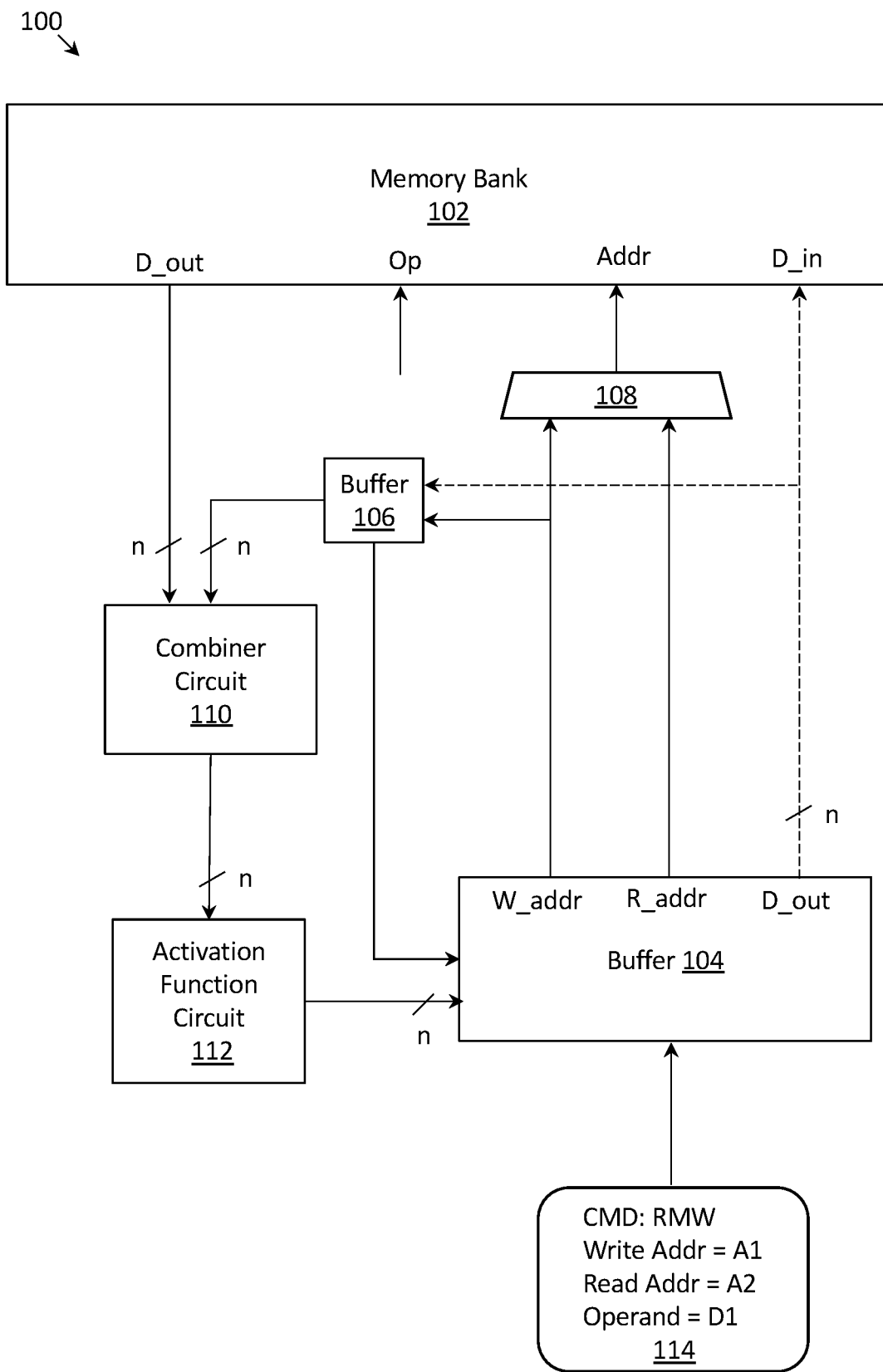
FIGS. 2A-2H depict block diagrams for illustrating a sequence of steps performed by the memory sub-system of FIG. 1 in order to process a read-modify-write request, in accordance with one embodiment of the invention.

FIGS. 2A-2H depict a sequence of block diagrams which explain the operation of the memory sub-system 100 in more detail. As depicted in FIG. 2A, the read-modify-write request 114 may include several fields, including a command field which specifies a type of command of the request. As should be apparent, the type of command for the read-modify-write request 114 is a read-modify-write (RMW) command. The command field is necessary as the buffer 104 may receive other types of requests, such as read requests, write requests, etc., so the command field is necessary for the buffer 104 to distinguish between the various types of request. The handling of read and write requests by a memory bank are well known in the art, and will not be discussed in detail for the sake of conciseness. The read-modify-write request 114 may also include a write address (which is A1 in the present example), a read address (which is A2 in the present example) and an operand (which is D1 in the present example). In one use case, the read address may be different from the write address, while in another use case, the read address may be the same as the write address.

Figure 2B:
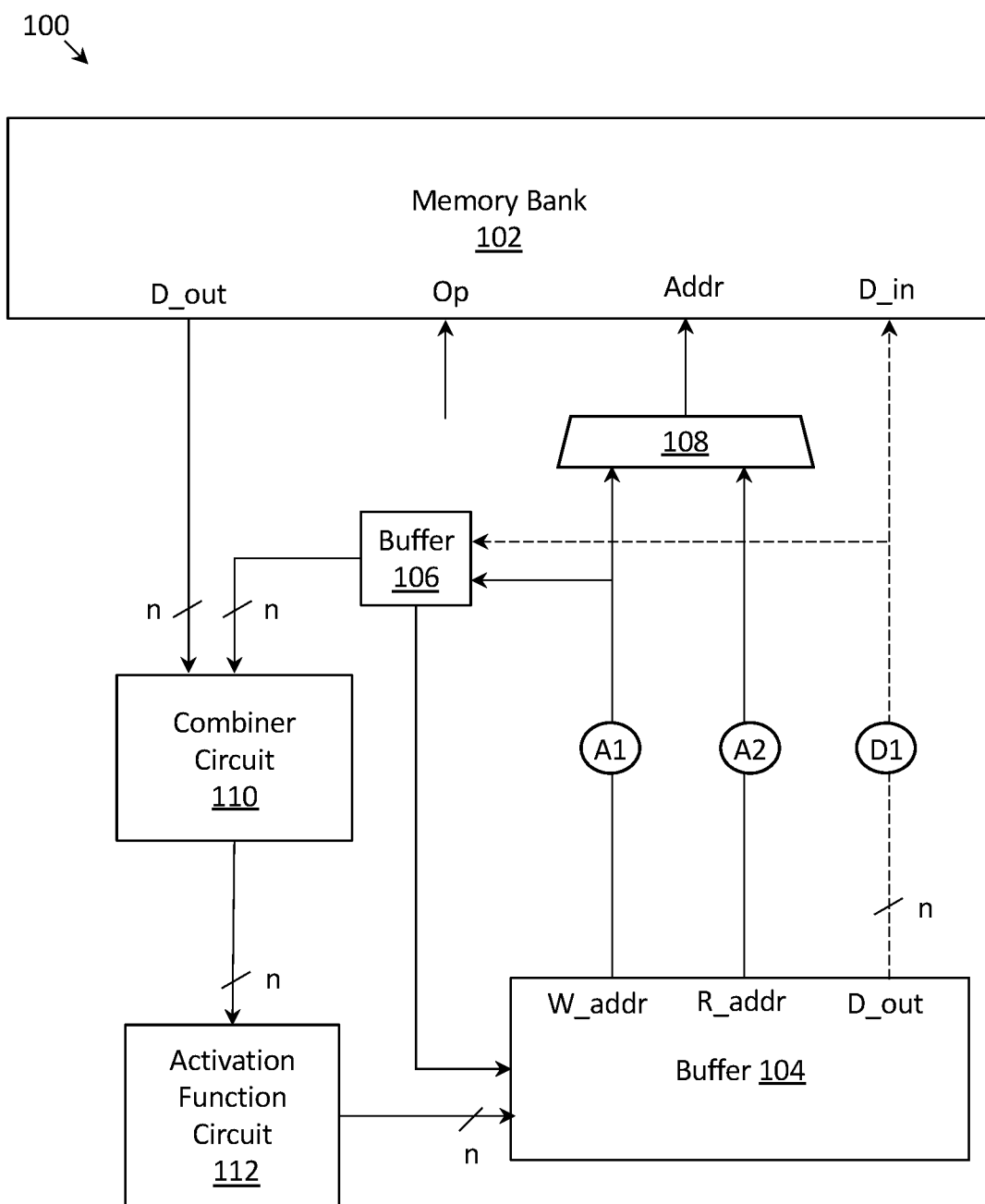

FIG. 2B depicts the output of the buffer 104 when the processing of the read-modify-write request 114 commences. At such time, the "W_addr" signal line of the buffer 104 may be set equal to the write address A1; the "R_addr" signal line of the buffer 104 may be set equal to read address A2; and the "D_out" signal line of the buffer 104 may be set equal to the operand D1 (which may be a vector with n values).

Figure 2C:
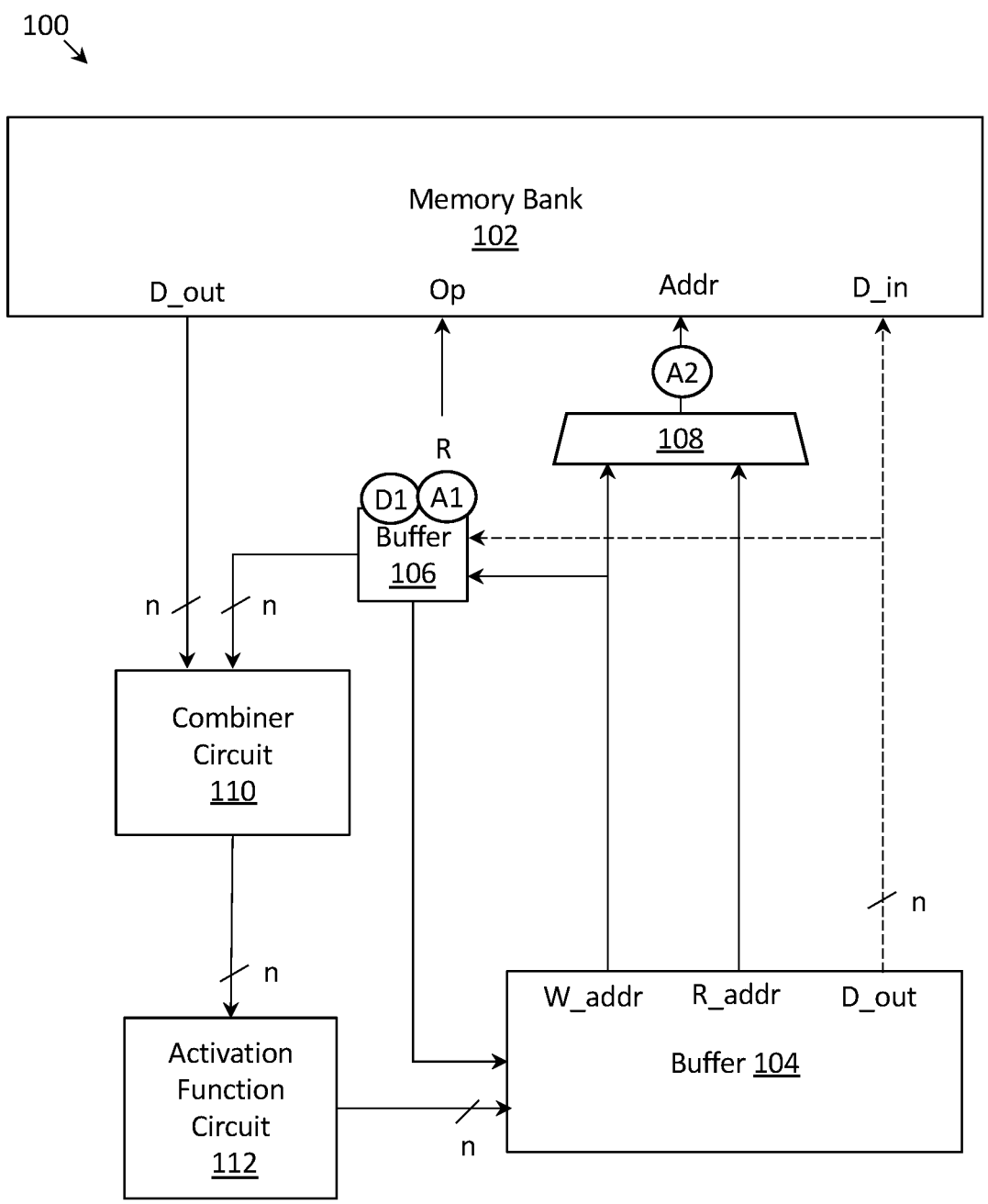

FIG. 2C depicts the multiplexor 108 transmitting the read address A2 to the memory bank 102 (after selecting the read address A2 from one of its two inputs). It is understood that the multiplexor 108 receives a selector signal (not depicted) from a controller (not depicted) which instructs the multiplexor 108 to select the read address A2 at the appropriate moment in time. As also shown in FIG. 2C, the operand D1 and write address A1 are stored in buffer 106, as such parameters need to be consumed at a later point in time. Memory bank 102 may include an "Op" signal line, in order for the controller (not depicted) to specify whether a read or a write operation is to be performed by the memory bank 102. In the moment depicted in FIG. 2C, the controller instructs the memory bank 102 to perform a read operation, as indicated by the "R" signal being provided to the "Op" signal line. In response, memory bank 102 reads the second operand D2 from the read address A2 (such reading operation not depicted in FIG. 2C).

Figure 2D:
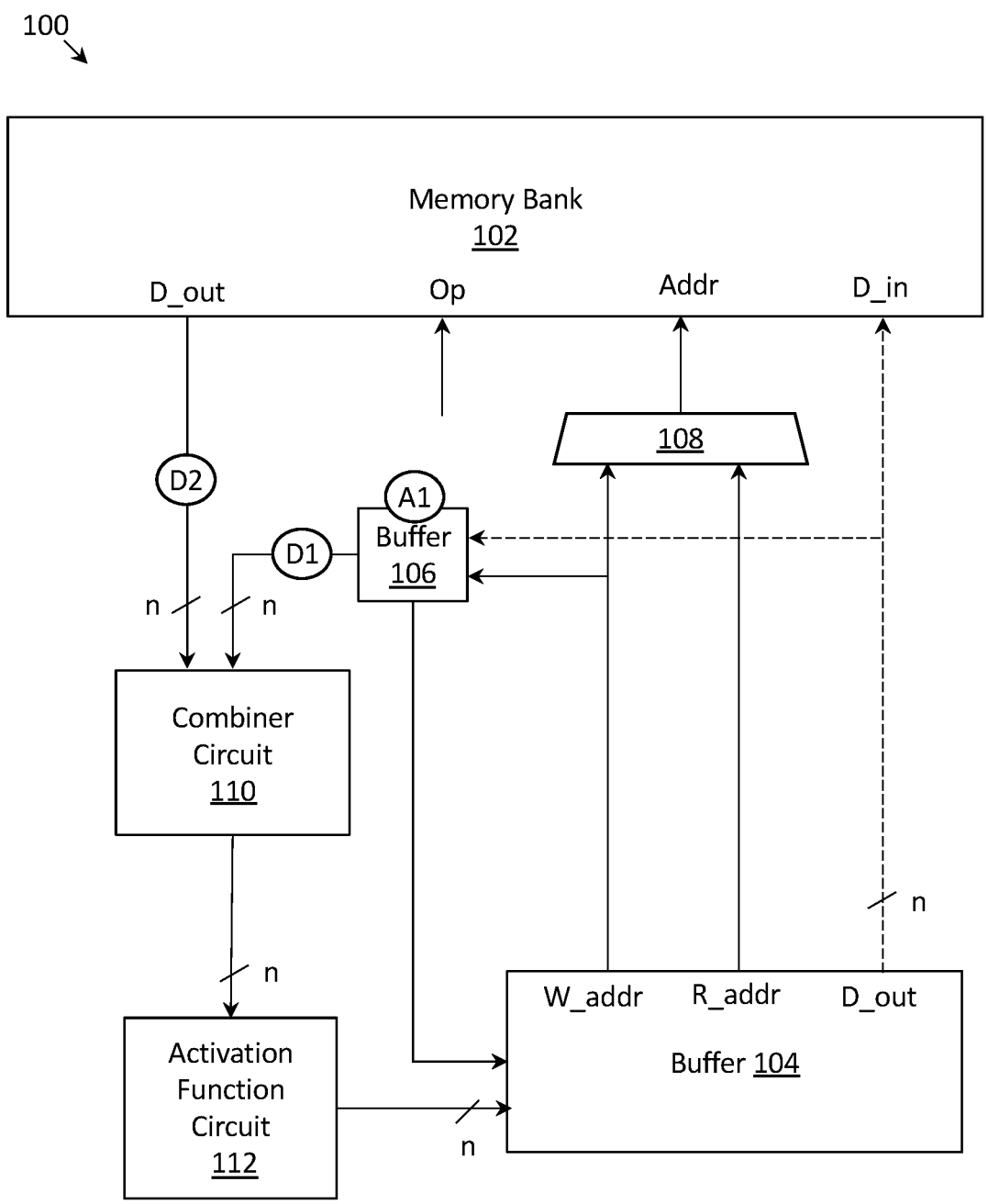

FIG. 2D depicts operand D1 being provided from the buffer 106 to the combiner circuit 110, and further depicts operand D2 being provided from the "D_out" signal line of memory bank 102 to the combiner circuit 110. As previously described, both of these operands may be vectors, each with n values.

Figure 2E:
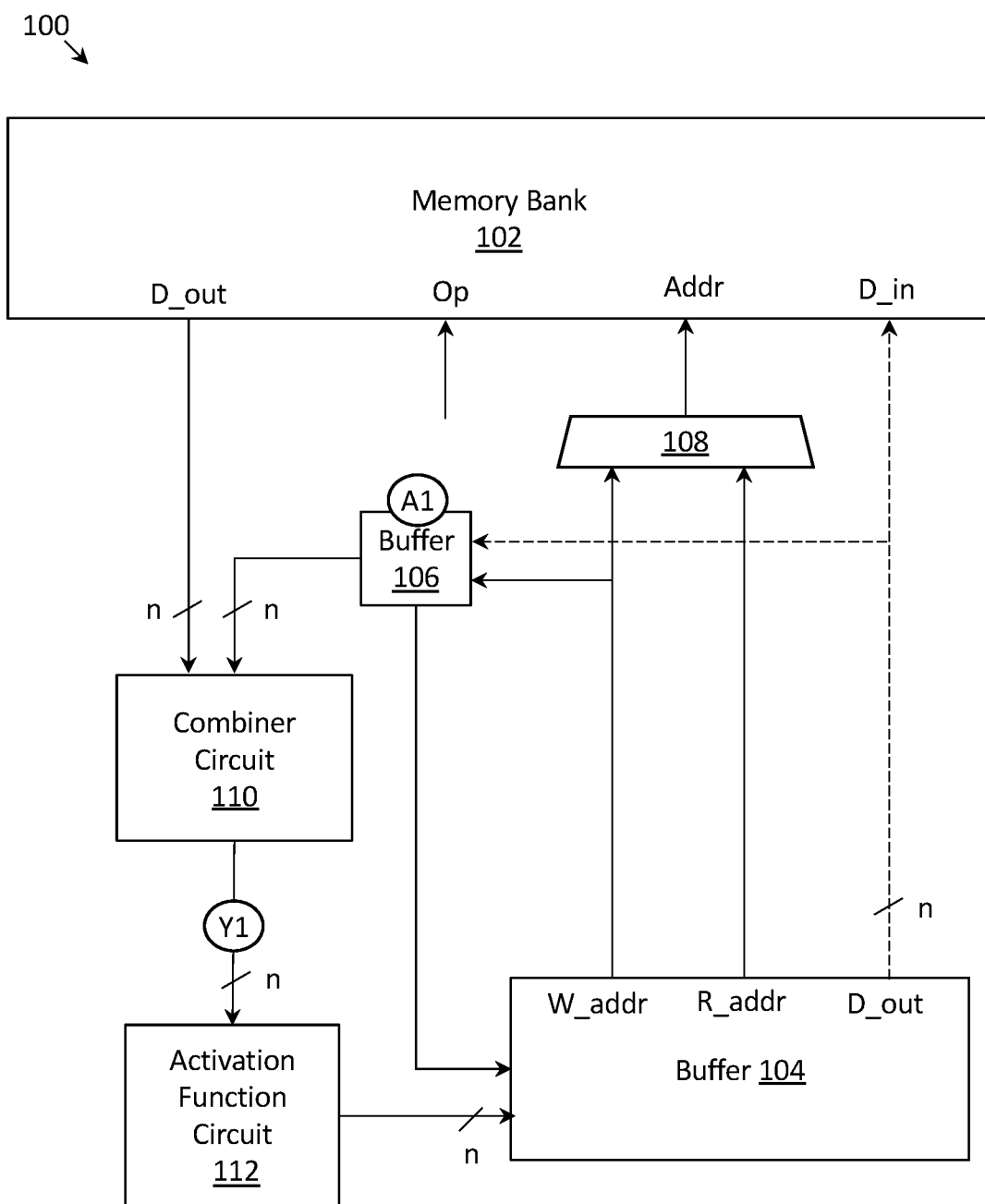

FIG. 2E depicts Y1 being provided as an output data of the combiner circuit 110. The output data Y1 may represent the element-wise sum of D1 and D2, the element-wise subtraction of D2 from D1 (or D1 from D2), the element-wise multiplication of D1 and D2, the element-wise maximum of D1 and D2, the element-wise minimum of D1 and D2, etc.

Figure 2F:
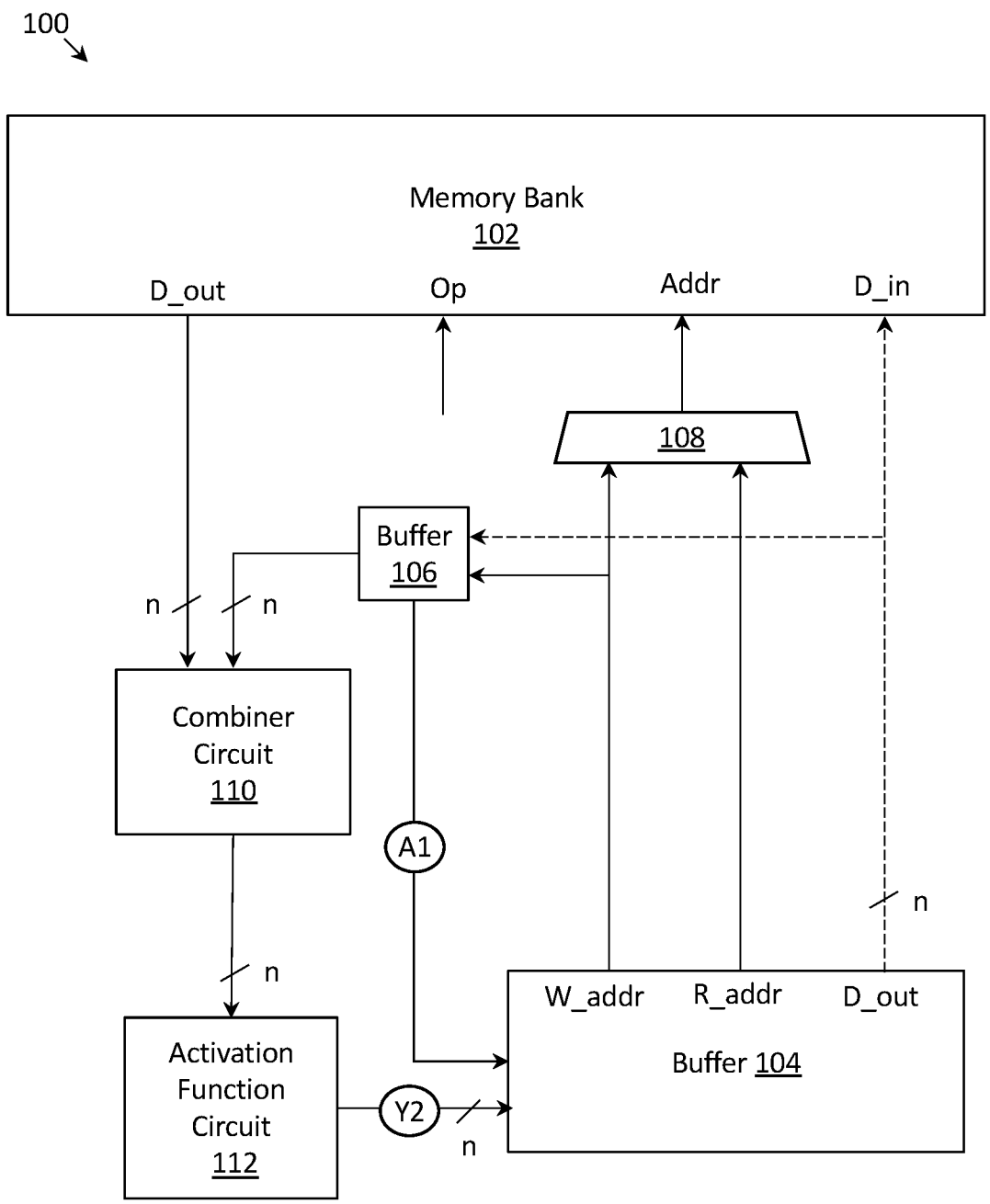

FIG. 2F depicts an activation function circuit 112 generating the output data Y2 from the input data Y1, and providing such output data Y2 to the buffer 104. As previously described, the output data Y2 may be a vector with n values. A common examples of an activation function is the ReLU (Rectified Linear Unit) function, but any general mathematical function could be provided by the activation function circuit 112. Further, it is understood that the activation function circuit 112 may be programmable to perform different mathematical operations (i.e., may be a circuit that is configurable to apply function 1 to the input in response to the selection of parameter a1, apply function 2 to the input in response to the selection of parameter a2, etc.). The write address A1 may also be provided from the buffer 106 to the buffer 104. While not depicted in its full extent for the sake of conciseness, it is understood that a write request is being stored in buffer 104 in FIG. 2F. The write request includes the command of "write," the write data of Y2 and the write address of A1.

Figure 2G:
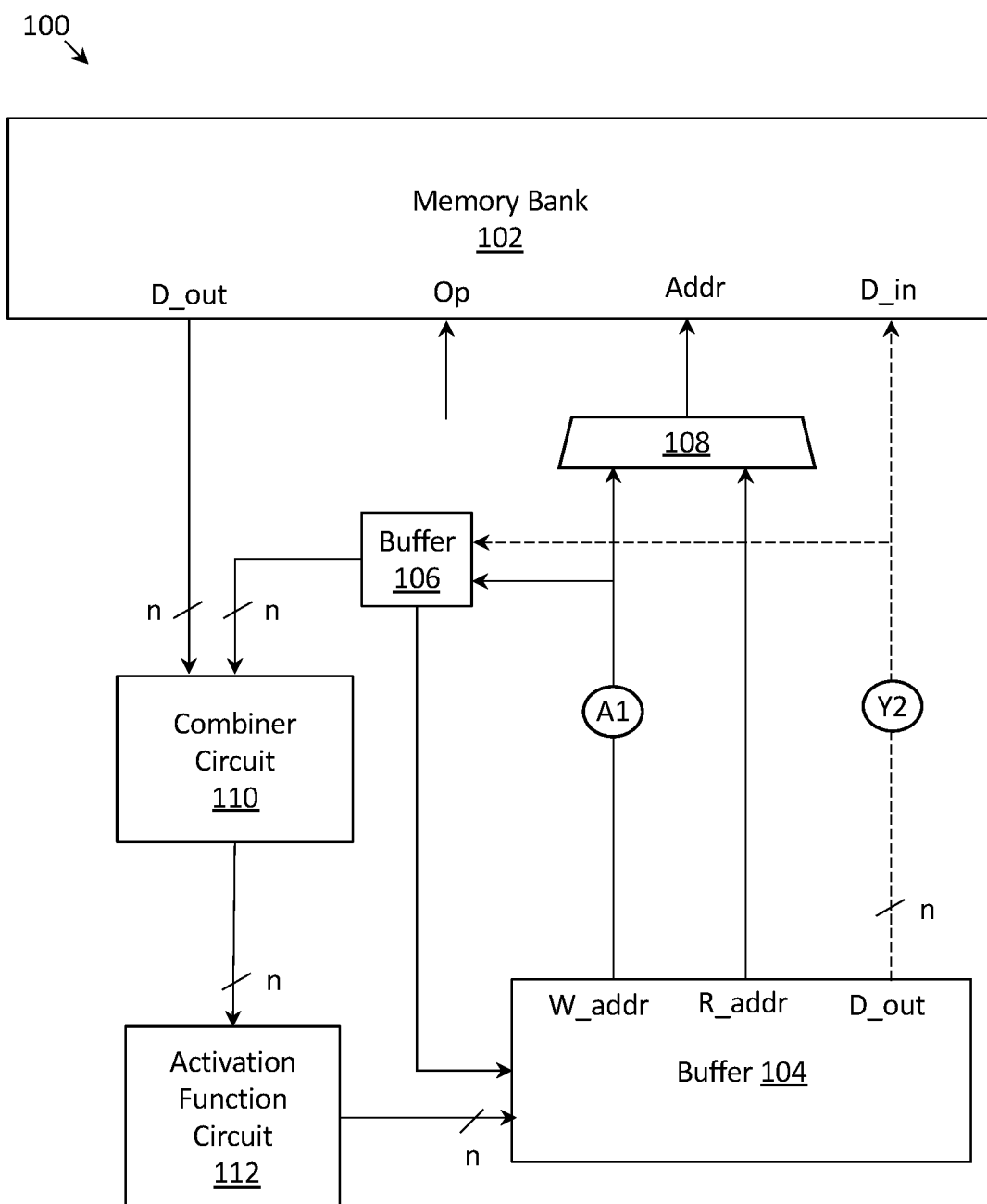
Figure 2H:
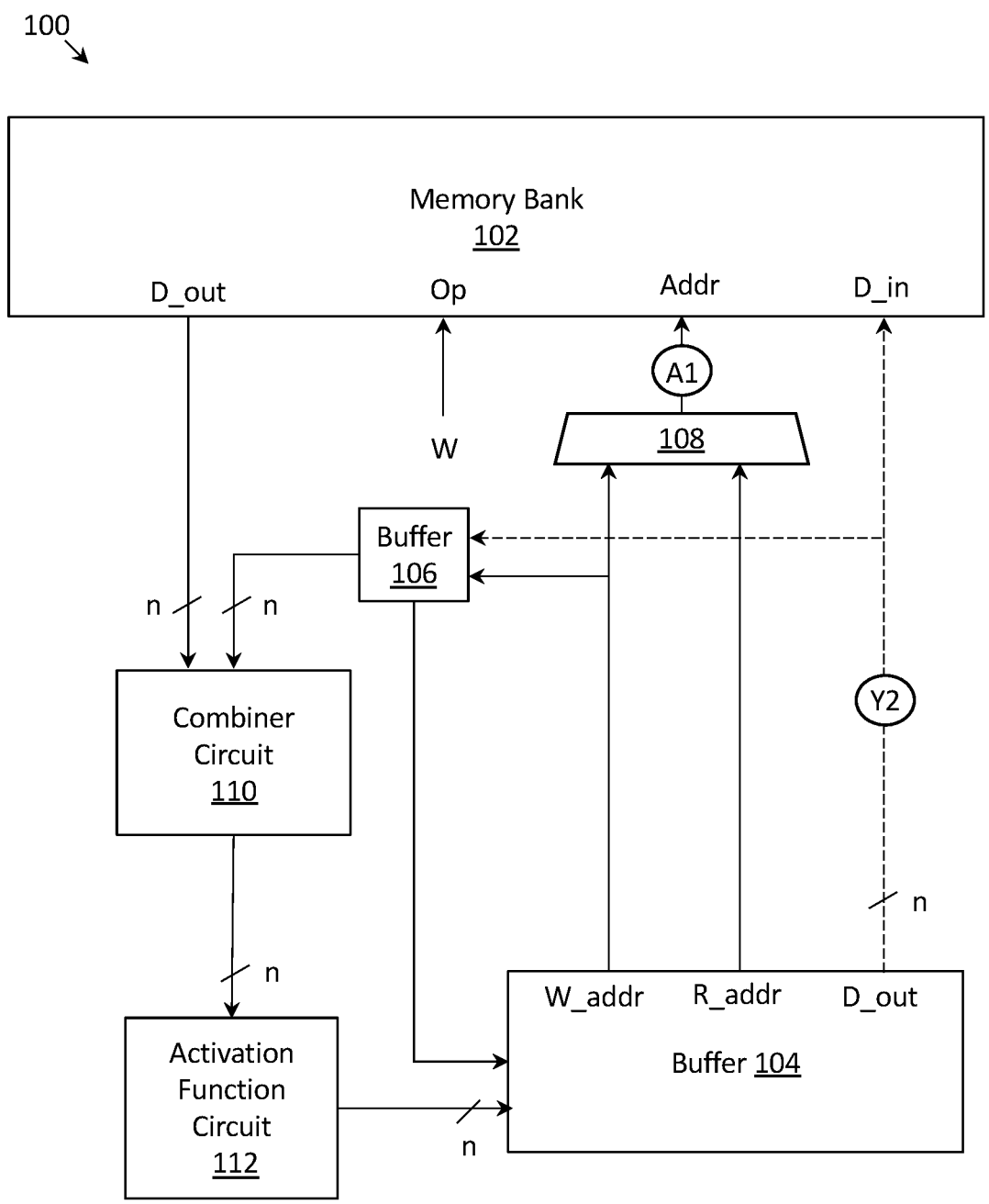

FIG. 2G depicts the first step associated with the transmittal of the write request (that was described above in FIG. 2F) from the buffer 104 to the memory bank 102, in which the write address A1 is provided to the "W_addr" signal line, and the write data Y2 is provided to the "D_out" signal line. FIG. 2H depicts the second step associated with the transmittal of the write request to the memory bank 102 in which the multiplexor 108 transmits the write address A1 to the memory bank 102 (after selecting the write address A1 from one of its two inputs based on a control signal of the controller). FIG. 2H also depicts the controller instructing the memory bank 102 to perform a write operation, as indicated by the "W" signal being provided to the "Op" signal line of the memory bank 102. In response, the write data Y2 is written to the memory bank 102 at address write A1 (such writing operation not depicted in FIG. 2H).

Figure 3:
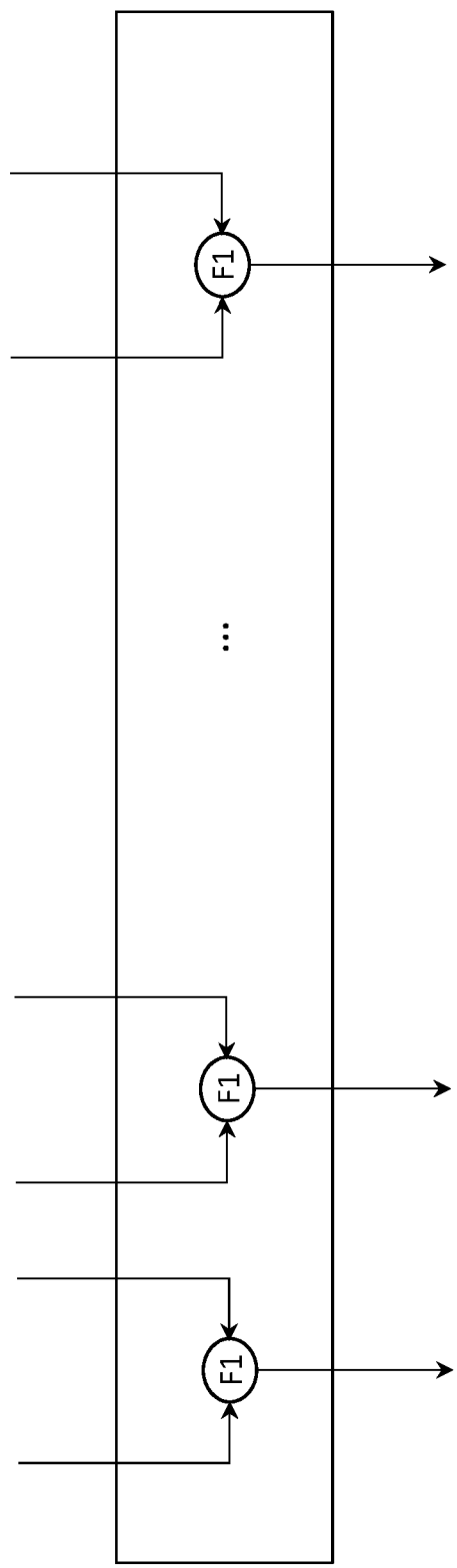
FIG. 3 depicts a block diagram with additional details of the combiner circuit, in accordance with one embodiment of the invention.

FIG. 3 depicts a block diagram with additional details of the combiner circuit 110. As depicted in FIG. 3, the combiner circuit 110 may include a plurality of functions, F1, each generating one output value from two input values. The multiple instances of function F1 indicate that the same function may be applied to each pair of inputs. F1 may be an adder circuit, a multiplier circuit, a circuit that return the maximum of two values, a circuit that return the minimum of two values, etc.

Figure 4:
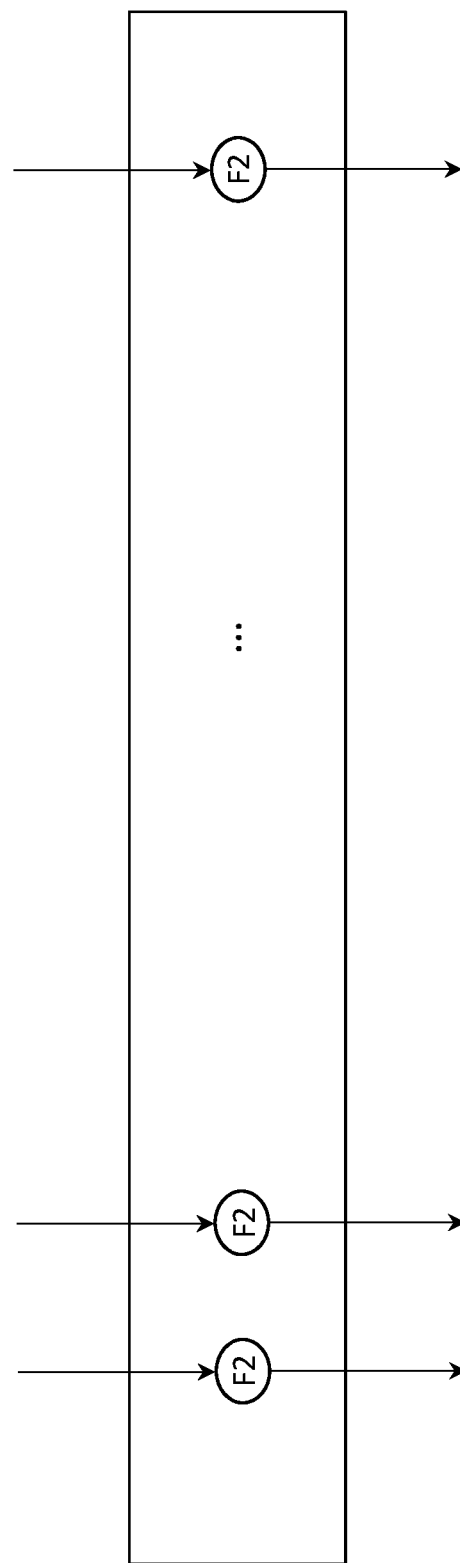
FIG. 4 depicts a block diagram with additional details of the activation circuit, in accordance with one embodiment of the invention.

FIG. 4 depicts a block diagram with additional details of the activation circuit 112. As depicted in FIG. 4, the activation circuit 112 may include a plurality of functions, F2, each generating one output value from one input value. The multiple instances of function F2 indicate that the same function may be applied to each of the inputs. F2 may be the ReLU function or another mathematical function.

Figure 5:
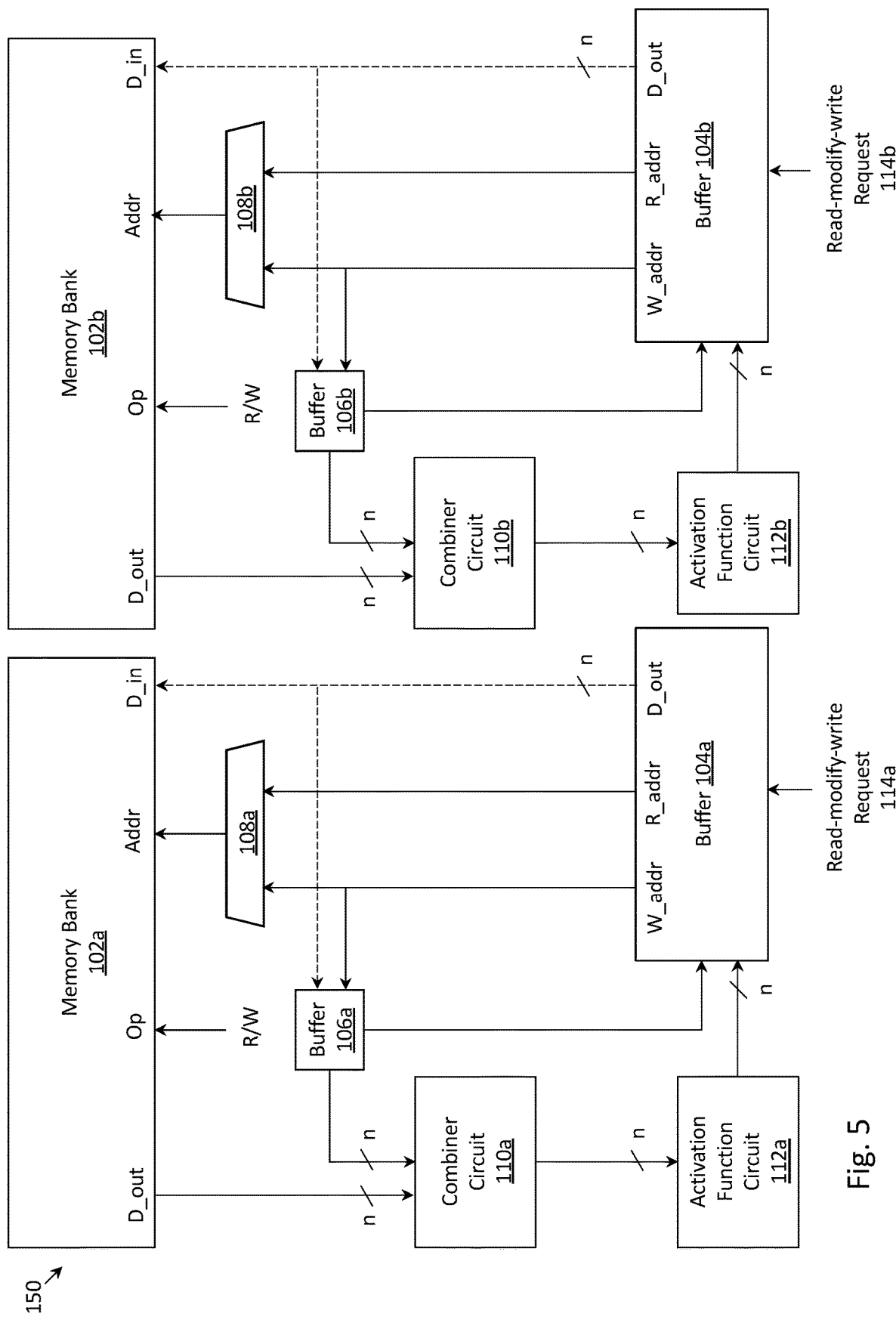
FIG. 5 depicts a block diagram of a memory system for processing read-modify-write requests in parallel, in accordance with one embodiment of the invention.

FIG. 5 depicts a block diagram of a memory system 150 which includes two instances of memory sub-system 100, allowing read-modify-write request 114a and read-modify-write request 114b to be independently and concurrently processed by separate hardware components. While two instances of memory sub-system 100 are depicted in system 150, it is understood that two of more instances of memory sub-system 100 may be present in general. For the sake of completeness, the above-description concerning each instance of memory sub-system 100 is repeated.

Buffer 104a may receive and store a read-modify-write request 114a that includes a read address, a write address and a first operand. In one embodiment, buffer 104a may be a first-in-first-out (FIFO) buffer. A second operand is then read from the memory bank 102a from a location specified by the read address of the read-modify-write request 114a. The first operand is combined with the second operand by combiner circuit 110a, and the output of the combiner circuit 110a is provided to an activation function circuit 112a. The output of the activation function circuit 112a a is then stored in the memory bank 102a at the location specified by the write address of the read-modify-write request 114a. The operation of buffer 106a and multiplexor 108a was previously explained above in FIGS. 2C-2H.

Buffer 104b may receive and store a read-modify-write request 114b that includes a read address, a write address and a first operand. In one embodiment, buffer 104b may be a first-in-first-out (FIFO) buffer. A second operand is then read from the memory bank 102b from a location specified by the read address of the read-modify-write request 114b. The first operand is combined with the second operand by combiner circuit 110b, and the output of the combiner circuit 110b is provided to an activation function circuit 112b. The output of the activation function circuit 112b is then stored in the memory bank 102b at the location specified by the write address of the read-modify-write request 114b. The operation of buffer 106b and multiplexor 108b was previously explained above in FIGS. 2C-2H.

Logic (not depicted) or the controller (not depicted) appropriately routes each of the read-modify-write requests 114a, 114b to one of the memory banks 102a, 102b, such that the read address and the write address resides in that memory bank 102a, 102b. For instance, the read address and the write address of the read-modify-write request 114a resides in memory bank 102a. Similarly, the read address and the write address of the read-modify-write request 114b resides in memory bank 102b. In one embodiment, the combiner circuit 110a generates its output data (in response to the read-modify-write request 114a) while the combiner circuit 110b generates its output data (in response to the read-modify-write request 114b).

Figure 6:
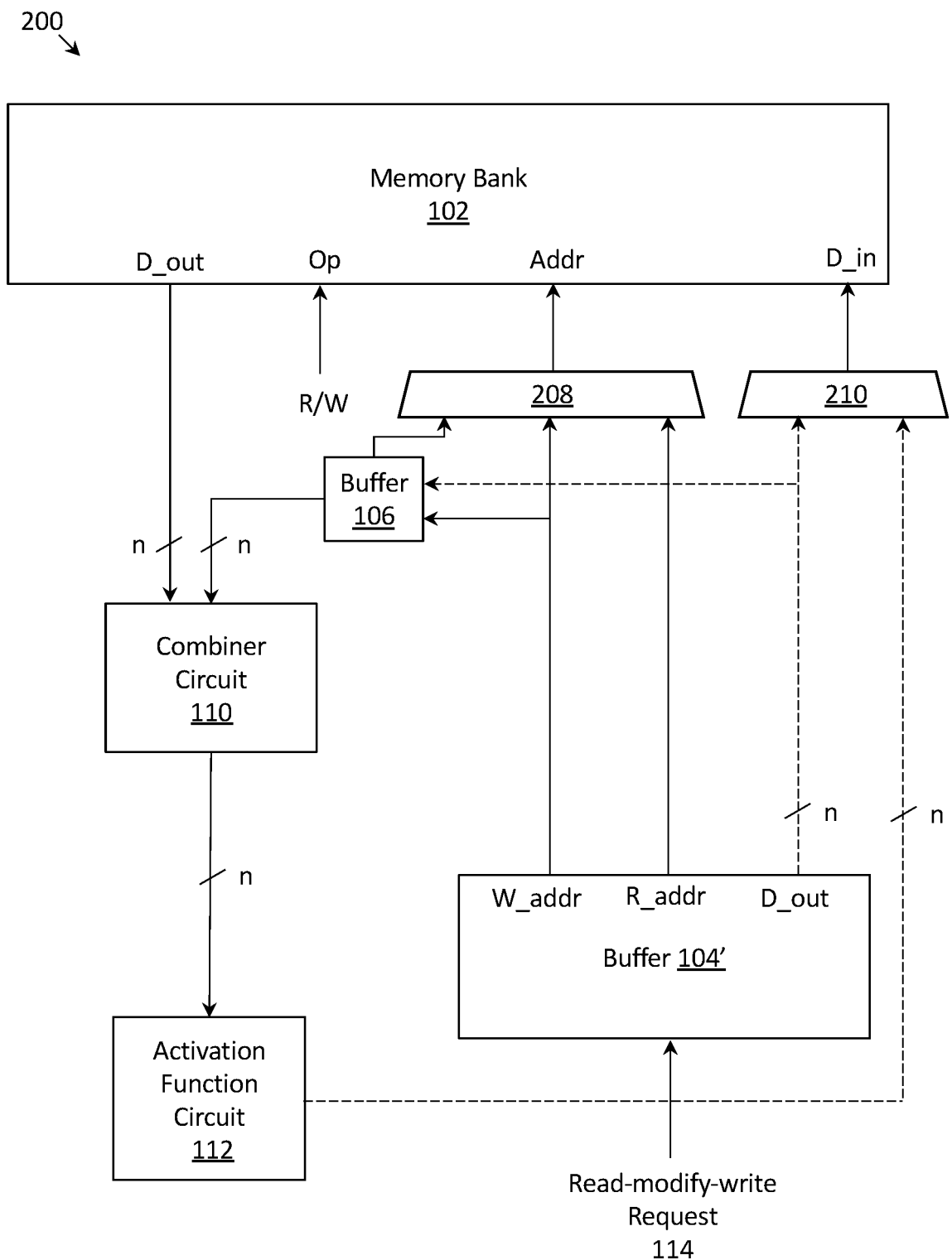
FIG. 6 depicts a block diagram of an alternative memory sub-system for processing read-modify-write requests, in accordance with one embodiment of the invention.

FIG. 6 depicts a block diagram of an alternative memory sub-system 200 for processing read-modify-write requests. The main difference between memory sub-system 200 and memory sub-system 100 is that the output of the activation function circuit 112 is stored directly into the memory bank 102 without first being stored in the buffer 104' in memory sub-system 200. In such alternative memory sub-system 200, however, the controller (not depicted) needs to mediate the access to the memory bank 102 so that such writing of the output of the activation function circuit 112 to the memory bank 102 happens during a window of time that the buffer 104' is not also accessing the memory bank 102. While not depicted, it is understood that two or more instances of memory sub-system 200 may be operated in parallel, in a similar manner as memory system 150 depicted in FIG. 5.

Figure 7A:
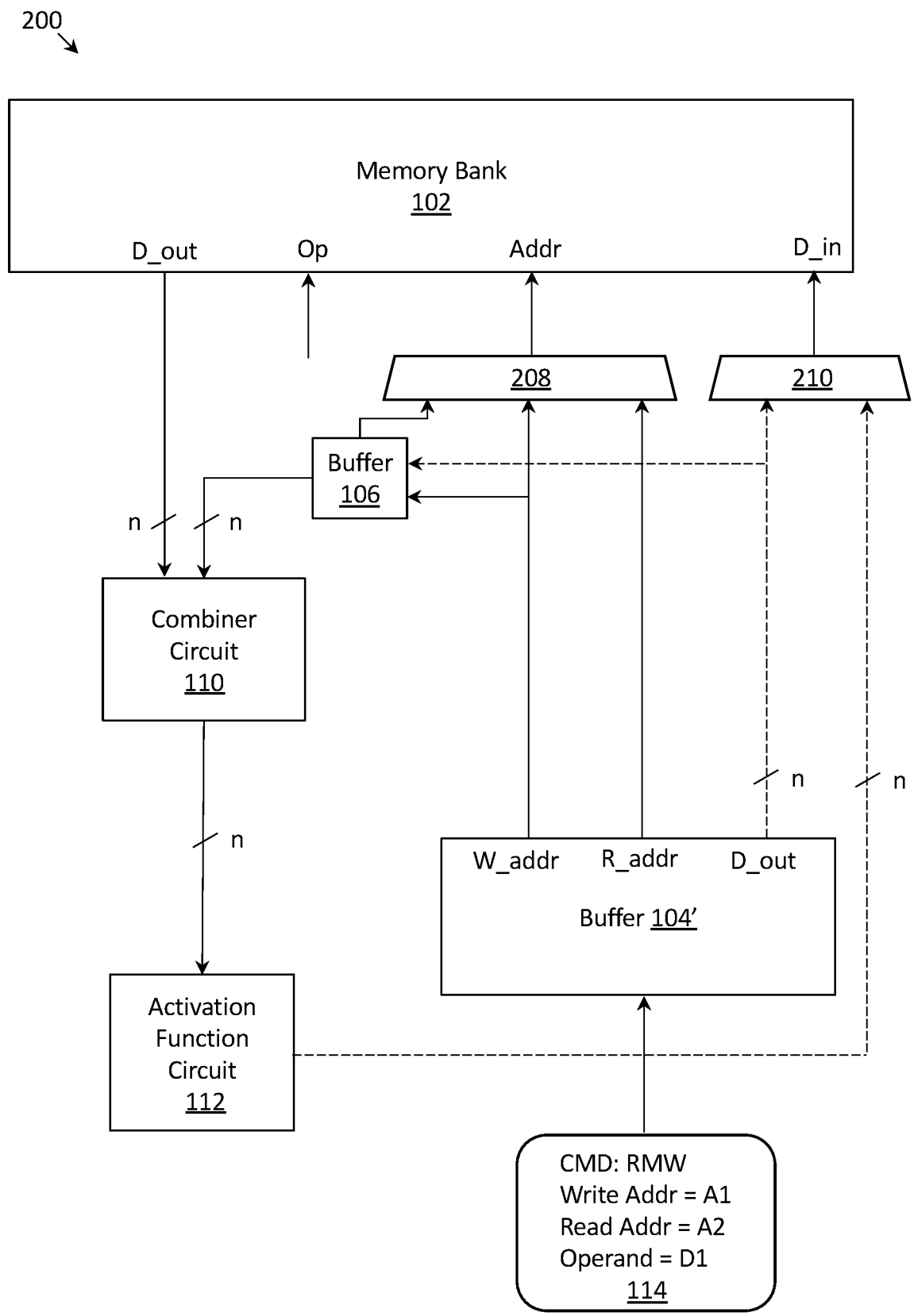
FIGS. 7A-7G depict block diagrams for illustrating a sequence of steps performed by the memory sub-system of FIG. 6 in order to process a read-modify-write request, in accordance with one embodiment of the invention.

FIGS. 7A-7G depict a sequence of block diagrams which explain the operation of the memory sub-system 200 in more detail. As depicted in FIG. 7A, the read-modify-write request 114 may include several fields, including a command field which specifies a type of command (which is RMW in the present example), a write address (which is A1 in the present example), a read address (which is A2 in the present example) and an operand (which is D1 in the present example).

Figure 7B:
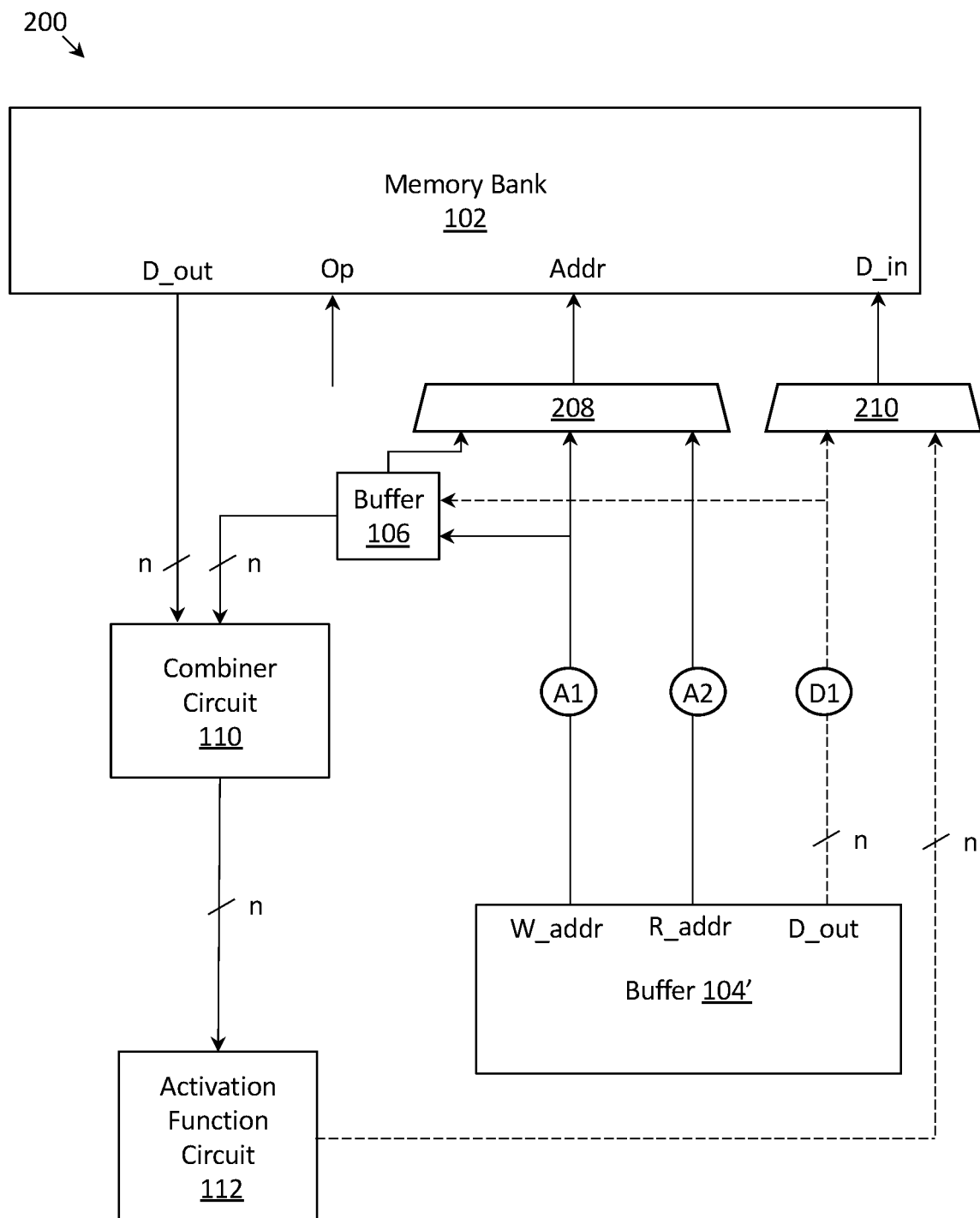

FIG. 7B depicts the output of the buffer 104' when the processing of the read-modify-write request 114 commences. At such time, the "W_addr" signal line of the buffer 104' may be set equal to write address A1; the "R_addr" signal line of the buffer 104' may be set equal to read address A2; and the "D_out" signal line of the buffer 104' may be set equal to D1 (which may be a vector with n values).

Figure 7C:
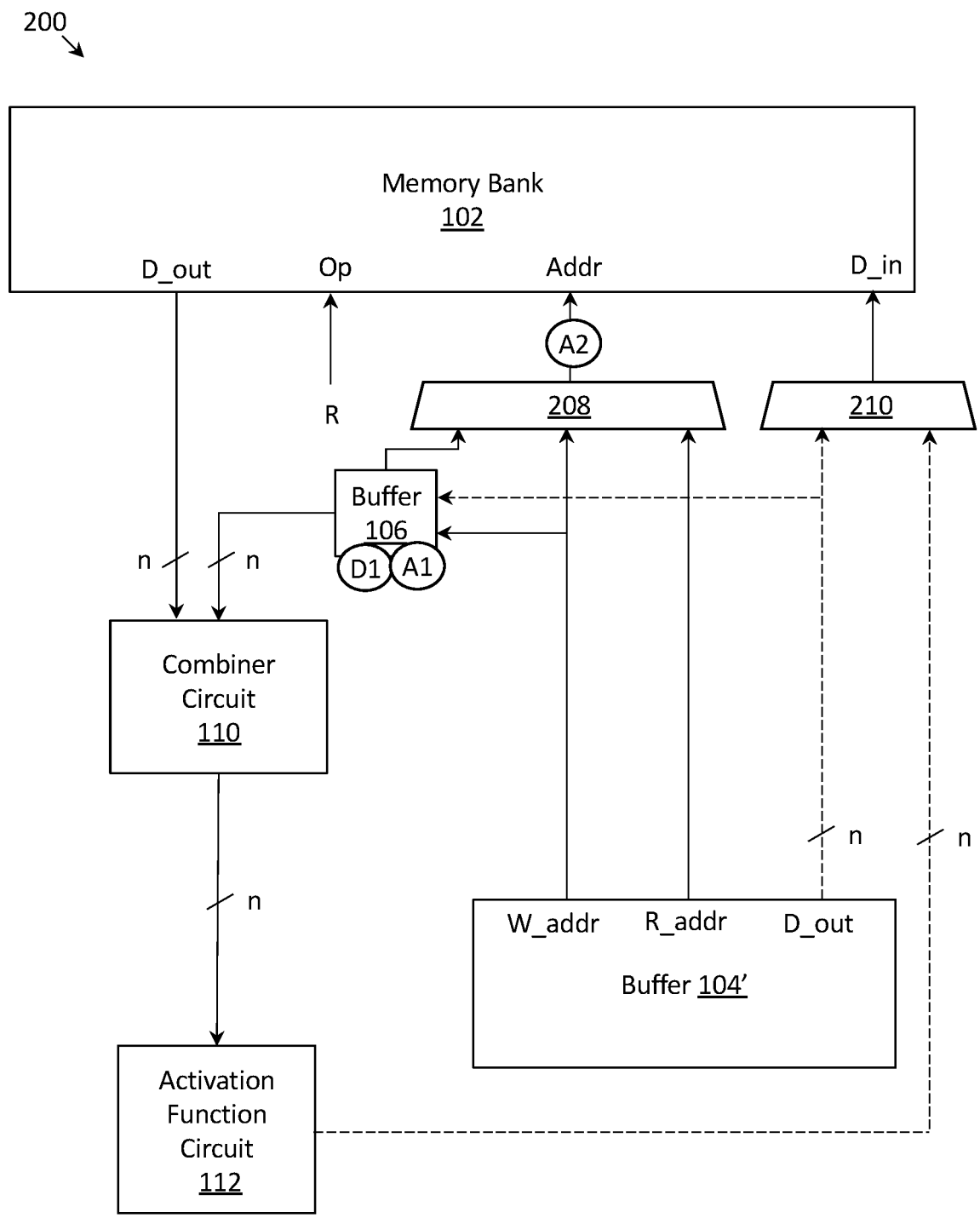

FIG. 7C depicts multiplexor 208 transmitting the read address A2 to the memory bank 102 (after selecting the read address A2 from one of its three inputs). It is understood that multiplexor 208 receives a selector signal (not depicted) from a controller (not depicted) which instructs the multiplexor 208 to select the read address A2 at the appropriate moment in time. As also shown in FIG. 7C, the operand D1 and write address A1 are stored in buffer 106, as such parameters need to be consumed at a later point in time. Memory bank 102 may include an "Op" signal line, in order for the controller (not depicted) to specify whether a read or a write operation is to be performed by the memory bank 102. In the instant moment, the controller instructs the memory bank 102 to perform a read operation, as indicated by the "R" signal being provided to the "Op" signal line. In response, memory bank 102 reads the second operand D2 from read address A2 (such reading operation not depicted in FIG. 7C).

Figure 7D:
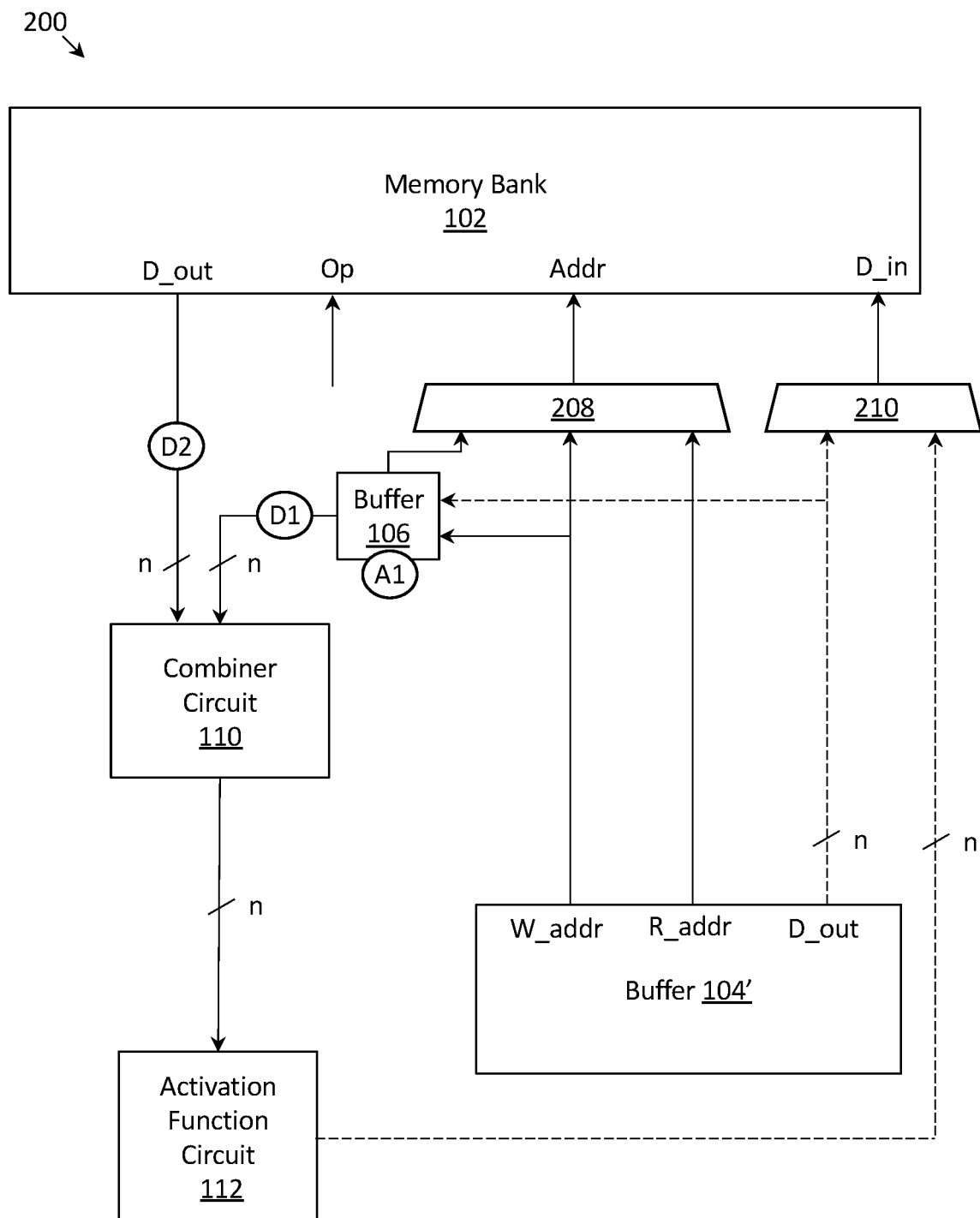

FIG. 7D depicts operand D1 being provided from the buffer 106 to the combiner circuit 110, and further depicts operand D2 being provided from the "D_out" signal line of memory bank 102 to the combiner circuit 110. As previously described, both of these operands may be vectors, each with n values.

Figure 7E:
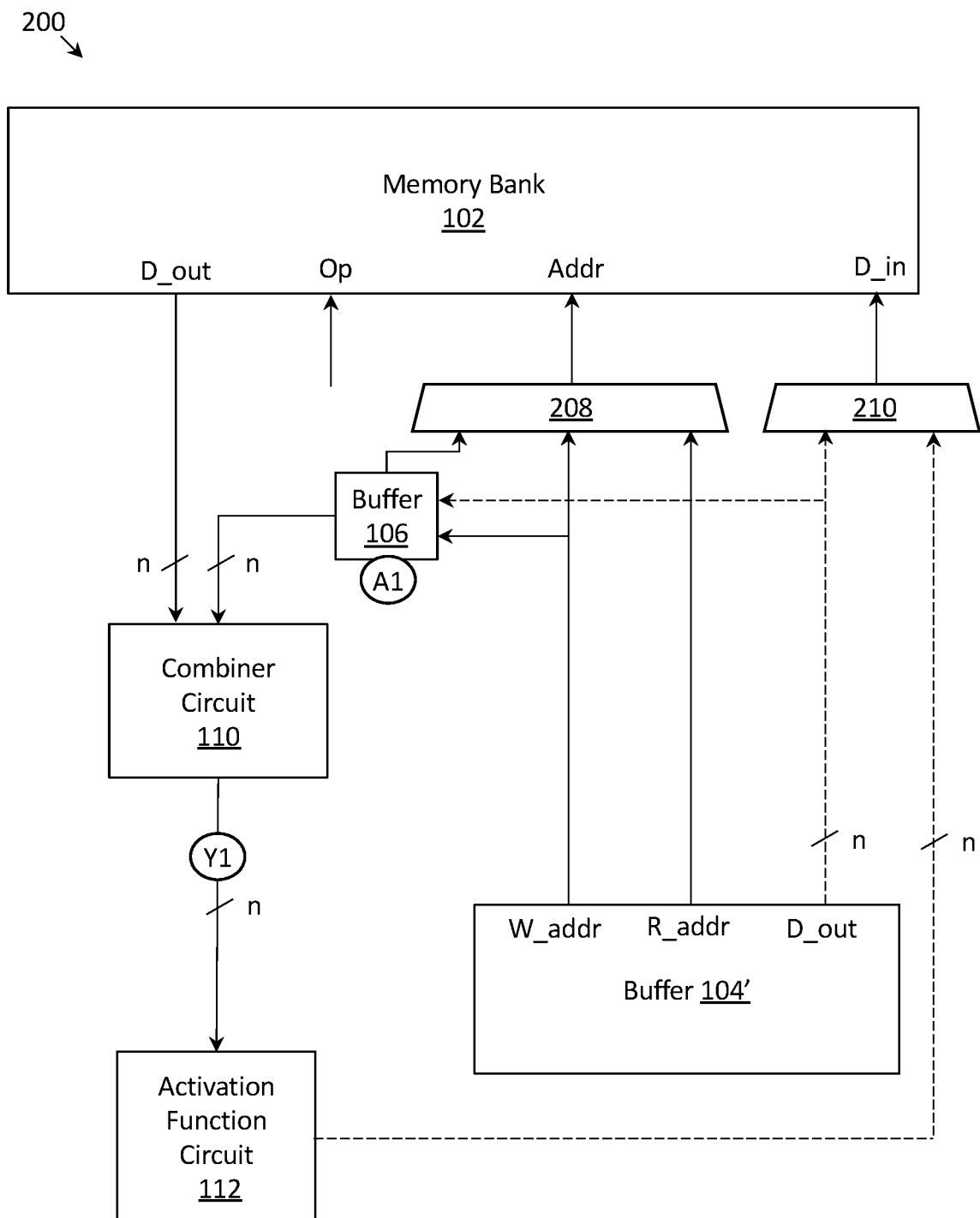

FIG. 7E depicts Y1 being provided as an output of the combiner circuit 110. Output data Y1 may represent the element-wise sum of D1 and D2, the element-wise subtraction of D2 from D1 (or D1 from D2), the element-wise multiplication of D1 and D2, the element-wise maximum of D1 and D2, the element-wise minimum of D1 and D2, etc.

Figure 7F:
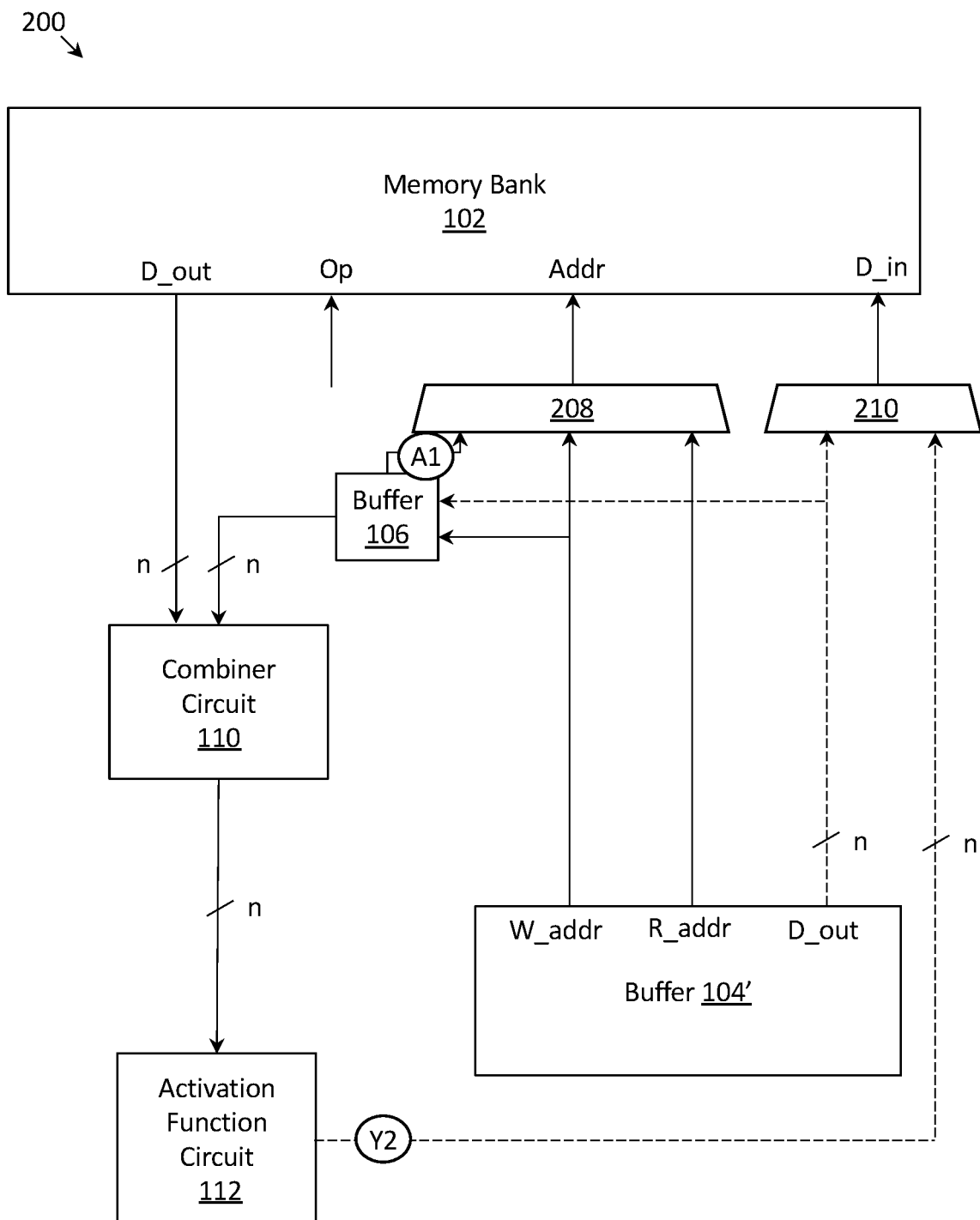

FIG. 7F depicts the activation function circuit 112 generating the output data Y2 from the input data Y1, and providing such input to the multiplexor 210. As previously described, the output data Y2 may be a vector with n values. A common example of an activation function is the ReLU (Rectified Linear Unit) function, but any general mathematical function could be implemented by activation function circuit 112. The write address A1 may also be provided from the buffer 106 to multiplexor 208.

Figure 7G:
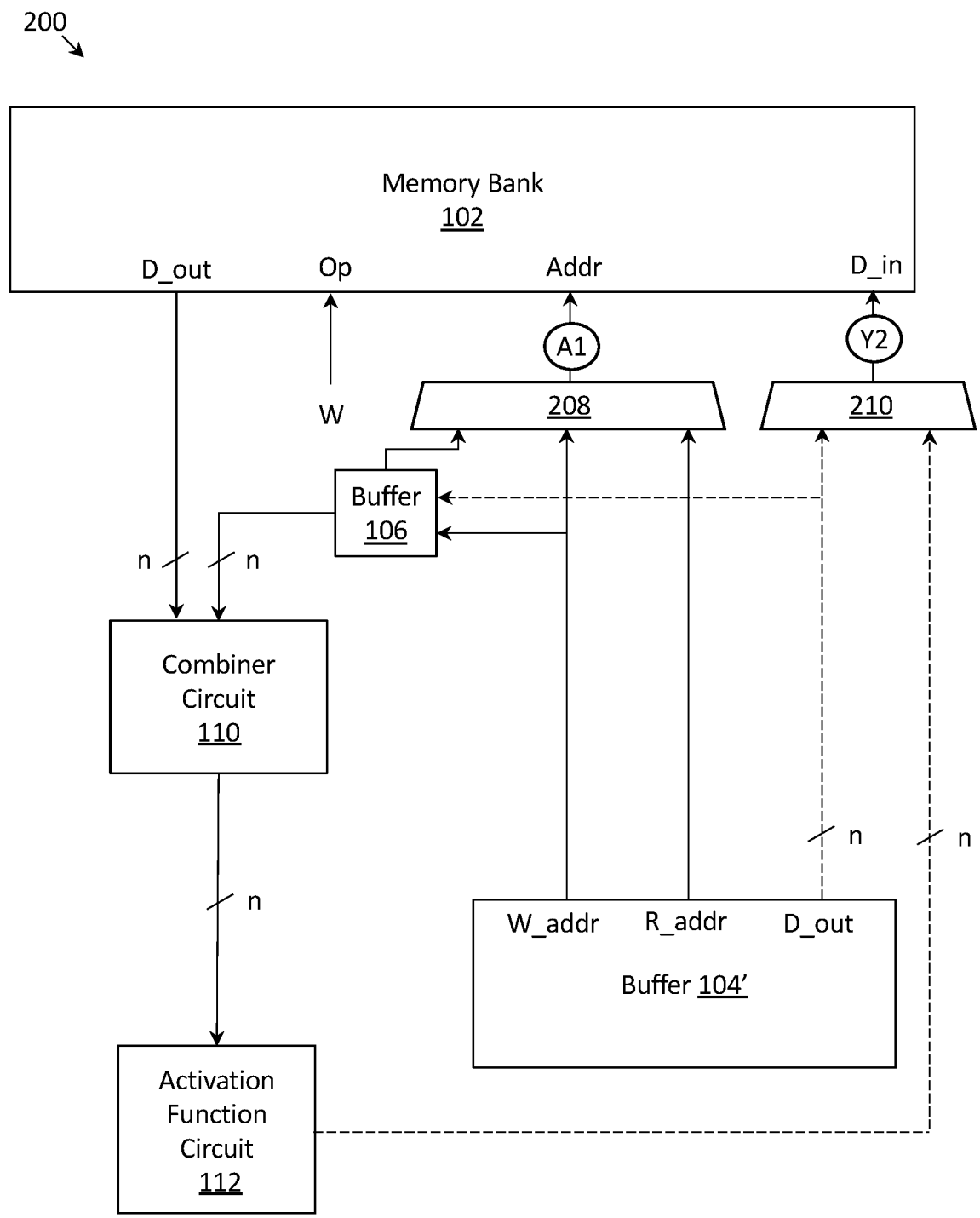

FIG. 7G depicts the multiplexor 208 transmitting the write address A1 to the memory bank 102 (after having selected the write address A1 from one of its three input ports based on a control signal from the controller). FIG. 7G also depicts the multiplexor 210 transmitting the output data Y2 to the memory bank 102 (after having selected the output data Y2 from one of its two input ports based on a control signal from the controller). FIG. 7G also depicts the controller instructing the memory bank 102 to perform a write operation, as indicated by the "W" signal being provided to the "Op" signal line of the memory bank 102. In response, the output data Y2 is written to the memory bank 102 at write address A1 (such writing operation not depicted in FIG. 7G).

Thus, methods and systems for processing read-modify-write requests have been described. It is to be understood that the above-description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A memory system, comprising:
a first memory bank;
a first buffer for storing a first read-modify-write request comprising a first read address, a first write address distinct from the first read address, and a first operand;
a first combiner circuit for computing first intermediary data based on the first operand and a second operand read from a first location of the first memory bank as specified by the first read address, wherein the first write address specifies a second location in the first memory bank where first activation data based on the first intermediary data is written;
a first activation function circuit for generating first activation data based on the first intermediary data, wherein the first buffer is configured to store the first activation data prior to the first activation data being written to the first memory bank;
a second memory bank;
a second buffer for storing a second read-modify-write request comprising a second read address, a second write address distinct from the second read address, and a third operand;
a second combiner circuit for computing second intermediary data based on the third operand and a fourth operand read from a first location of the second memory bank as specified by the second read address, wherein the second write address specifies a second location in the second memory bank where second activation data based on the second intermediary data is written; and
a second activation function circuit for generating second activation data based on the second intermediary data, wherein the second buffer is configured to store the second activation data prior to the second activation data being written to the second memory bank.

2. The memory system of claim 1, wherein the first combiner circuit is configured to generate the first intermediary data while the second combiner circuit generates the second intermediary data.

3. The memory system of claim 1,
wherein the first operand, the second operand, the first intermediary data, and the first activation data each comprises a vector of values, and
wherein the first combiner circuit comprises a plurality of adders.

4. A method, comprising:
storing, at a first buffer, a read-modify-write request comprising a read address, a write address distinct from the read address, and a first operand;
reading a second operand from a first location within a memory bank as specified by the read address;
computing, by a combiner circuit, intermediary data based on the first operand and the second operand;
generating, by an activation function circuit, activation data based on the intermediary data;
storing, in the first buffer, the activation data based on the intermediary data; and
writing the activation data from the first buffer to a second location within the memory bank as specified by the write address.

5. The method of claim 4,
wherein the first operand, the second operand, the intermediary data, and the activation data each comprises a vector of values, and
wherein the combiner circuit comprises a plurality of adders.

6. The method of claim 4, wherein the activation data is associated with the write address in the first buffer.

7. The method of claim 4, further comprising, prior to computing the intermediary data, storing the first operand and the write address in a second buffer.

8. The memory system of claim 1, further comprising:
a first multiplexor for providing either the first read address or the first write address of the first read-write-modify request from the first buffer to the first memory bank; and
a second multiplexor for providing either the second read address or the second write address of the second read-write-modify request from the second buffer to the second memory bank.

* * * * *